(12) United States Patent
Masuda

(10) Patent No.: US 6,541,994 B2
(45) Date of Patent: Apr. 1, 2003

(54) SEMICONDUCTOR DEVICE WITH A SELF-TESTING FUNCTION AND A METHOD FOR TESTING THE SEMICONDUCTOR DEVICE

(75) Inventor: Kazuaki Masuda, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/849,396

(22) Filed: May 7, 2001

(65) Prior Publication Data

US 2002/0158651 A1 Oct. 31, 2002

(30) Foreign Application Priority Data

May 8, 2000 (JP) .................................. 2000-135093

(51) Int. Cl.$^7$ .............................................. G01R 31/26
(52) U.S. Cl. ........................ 324/765; 324/73.1; 324/763
(58) Field of Search ............................... 324/73.1, 765, 324/763, 158.1; 714/724, 733, 736; 702/117, 119

(56) References Cited

U.S. PATENT DOCUMENTS 5,821,529 A * 10/1998 Chihara et al. ......... 250/214 R
5,987,635 A * 11/1999 Kishi et al. ................. 714/724
6,157,200 A * 12/2000 Okayasu ..................... 324/753
6,255,843 B1 * 7/2001 Kurihara ................... 324/158.1

FOREIGN PATENT DOCUMENTS

JP          2-10179         1/1990

* cited by examiner

*Primary Examiner*—Kamand Cuneo
*Assistant Examiner*—Minh N. Tang
(74) *Attorney, Agent, or Firm*—McGinn & Gibb, PLLC

(57) ABSTRACT

A semiconductor device and a method for testing the semiconductor device of the present invention includes n macro blocks which process input data supplied from input terminals and output the data from output terminals, a test circuit which supplies test data for testing the macro blocks and receives the test data processed by the macro blocks in the test mode and a test path which supplies the test data from the test circuit to the input terminal of the macro block, supplies data of the output terminal of the k-th (k=1 to (n−1)) macro block to the input terminal of the macro block to the test circuit in the test mode. One macro block can be selected randomly to be tested.

13 Claims, 9 Drawing Sheets

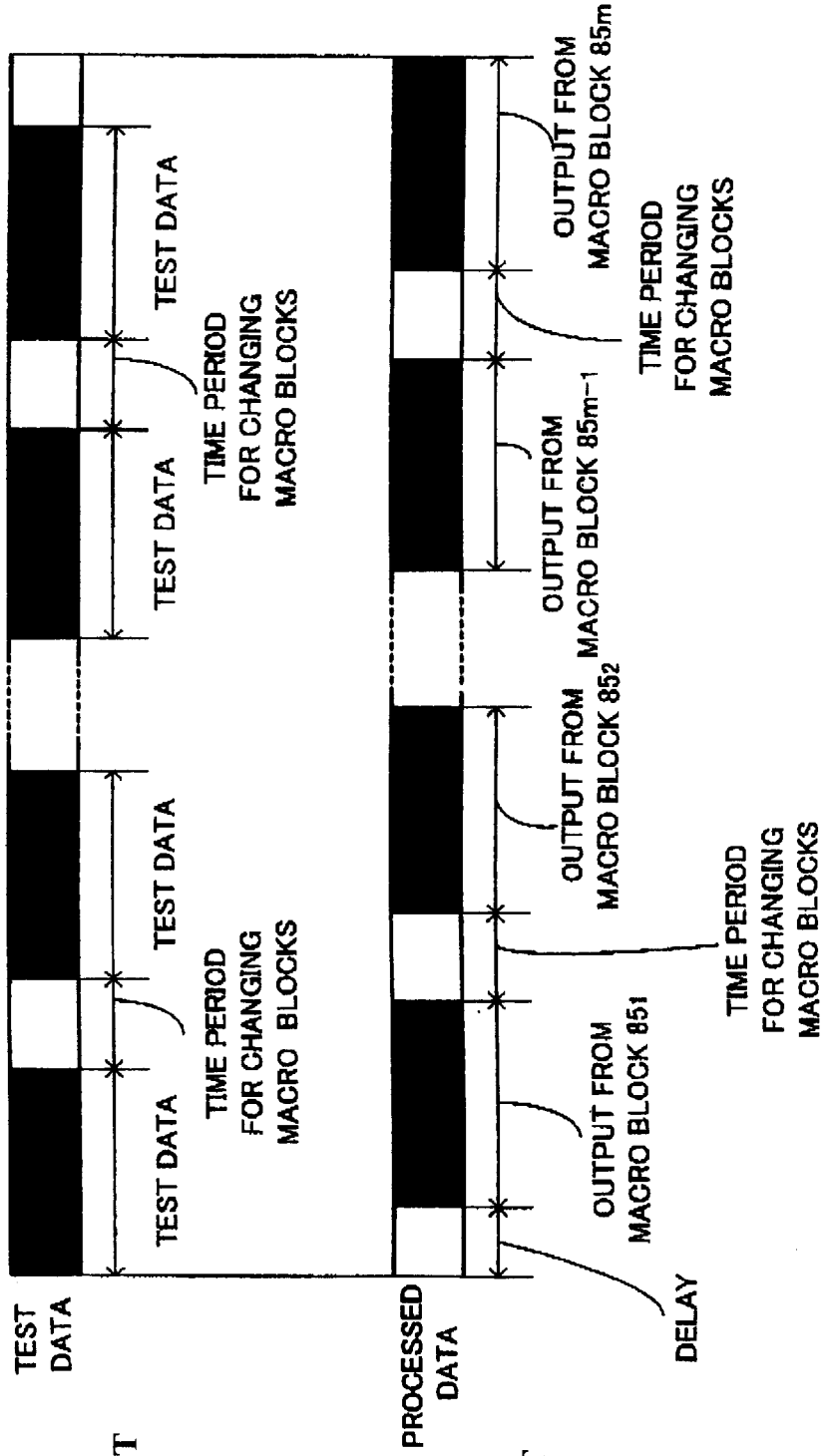

SEMICONDUCTOR DEVICE WITH A SELF-TESTING FUNCTION AND A METHOD FOR TESTING THE SEMICONDUCTOR DEVICE

BACKGROUND OF THE INVENTION

1. Field of the Invention

The present invention relates to a semiconductor device having a self-testing function and a method for testing the semiconductor device, and more particularly, to a semiconductor device having a function to test a plurality of macro blocks and a method for testing the macro blocks.

2. Description of the Related Art

FIG. 7 is a block diagram for explaining a semiconductor device having a self-testing function and a method for testing the semiconductor device.

In the semiconductor device shown in FIG. 7, in a normal operation mode, input data Din is supplied to each of macro blocks $75_1$, $75_2$. and $75_m$, . . . Each of macro blocks $75_1$, $75_2$, . . . and $75_m$ process the input data Din and output the processed data Dout.

In a test mode, test circuit 71 supplies test data (data used for testing) TTD to a circuit block 74 via a test bus 72. The test data TTD is input to m (m represents an integer more than 1) macro blocks $75_1$, $75_2$, . . . and $75_m$ in the circuit block 74. Bus selectors $79_1$, $79_2$, . . . and $79_m$ respectively included in the macro blocks $75_1$, $75_2$, . . . and $75_m$ supply the test data TTD from the test circuit 71 to network circuits $76_1$, $76_2$, . . . and $76_m$. Each of the network circuits $76_1$, $76_2$, . . . and $76_m$ process the test data TRD and output processed data TRD to the test circuit 71 through test buses $73_1$, $73_2$, . . . and $73_m$, respectively. The test circuit 71 compares the supplied processed data TRD with the expected value.

In the semiconductor device shown in FIG. 7, the test data TTD output from the test circuit 71 is supplied parallel to all of the macro blocks $75_1$, $75_2$, . . . and $75_m$, and processed parallel by the macro blocks $75_1$, $75_2$, . . . and $75_m$. Further, the respective processed data TRD of the macro blocks $75_1$, $75_2$, . . . and $75_m$ are transmitted parallel to the test circuit 71. Due to this parallelism, regardless of the number of the macro blocks $75_1$, $75_2$, . . . and $75_m$, time period required for the test is almost the same as time period for testing a single macro block.

FIG. 8 is a block diagram for explaining another example of a conventional semiconductor device having a self-testing function. In the semiconductor device shown in FIG. 8, a test circuit 81 supplies test data TTD to a circuit block 84 via a test bus 82. A bus selector $89_i$ (i represents an integer from 1 to m) selected by the test circuit 81 from among m bus selectors $89_1$, $89_2$, . . . and $89_m$ respectively included in macro blocks $85_1$, $85_2$, . . . and $85_m$ supplies the test data TTD to a network circuit $86_i$ in the selected macro block $85_i$. The network circuit $86_i$ processes the test data TTD and outputs processed data TRD. A bus selector $88_i$ supplies the processed data TRD to the test circuit 81 via a test bus 83. The test circuit 81 compares the received processed data TRD with the expected value.

The test circuit 81 repeats the above stated testing procedures for all the macro blocks, selecting one macro block at a time. FIGS. 9A and 9B are time charts showing the testing procedures of the semiconductor device shown in FIG. 8. As known from FIGS. 9A and 9B, time period for testing the semiconductor device shown in FIG. 8 is calculated by the equation below.

time period for testing the semiconductor device=(transmission time of the test data)×(number of macro blocks)+(time period for changing macro blocks)×(number of macro blocks−1)+delay time The delay is caused by internal transmission of data in a macro block, most part of which is a time period required for data processing by a macro block.

The semiconductor device shown in FIG. 7 requires the same number of test buses and circuits for comparing the processed data TRD with the expected data, as the number of macro blocks. Therefore, this semiconductor device requires a large occupation area.

The semiconductor device shown in FIG. 8 cannot test a plurality of macro blocks parallel or at a time. Thus, if the number of macro blocks to be tested increases, more time is needed for testing those macro blocks.

An example of a semiconductor device which performs testing by individually transmitting test data to a plurality of macro blocks as shown in FIG. 8 is disclosed in Unexamined Japanese Patent Application KOKAI Publication No. H2-10179. In testing, the semiconductor device disclosed in this publication selects a macro block to be tested under control by a test interface circuit equipped in each macro block, transmits test data to the selected macro block and tests this macro block individually. This disclosure is incorporated herein by reference.

SUMMARY OF THE INVENTION

Accordingly, it is an object of the present invention to provide a semiconductor device having a testing function and a method for testing a plurality of macro blocks in a short period of time.

It is another object of the present invention to provide a semiconductor device with a self-testing function which occupies a small area.

To achieve the above objects, a semiconductor device with a self-testing function according to the first aspect of the present invention comprises:

a first to n-th (n is an integer more than 1) macro blocks each of which receives input data, processes the input data, and outputs processed data;

a data path which supplies data to-be-processed to the n macro blocks, and transmits processed data processed by and output from the n macro blocks respectively, in a normal operation mode;

a test circuit which outputs test data for testing the n macro blocks and receives the test data processed by the n macro blocks, in a test mode; and a test path which supplies the test data output from the test circuit to the first macro block, supplies data output from the h-th (h is an integer from 1 to (n−1)) macro block to the (h+1)th macro block and supplies data output from the n-th macro block to the test circuit.

The test path may comprise: a first test bus which transmits the test data output from the test circuit to the first macro block; connectors which transmit data output from the h-th macro block to the (h+1)th macro block; and a second test bus which transmits data output from the n-th macro block to the test circuit.

The test circuit may compare data received from the n-th macro block and an expected value, and detects that there is defect if received data substantially does not coincide with the expected value.

The test circuit may comprises: a supplier which supplies the test data; and a comparator which compares expected data with data received from the n-th macro block.

The test circuit may further comprise: a controller which designates j-th (j is an integer from 1 to n) macro block. In this case, it is desirable that the supplier supplies test data for testing the j-th macro block designated by the controller, the comparator compares expected data for the j-th macro block with data output from the j-th macro block, and the test path transmits the test data for testing the j-th macro block supplied from the supplier to the j-th macro block and supplies data output from the j-th macro block to the comparator.

For example, the controller performs control to test the j-th macro block individually, if any defect is found by the test circuit.

The test circuit may comprise a controller which designates j-th (j is an integer from 1 to n) macro block, a supplier which supplies test data for testing the j-th macro block designated by the controller, and a comparator which compares expected data for j-th macro block with data output from the j-th macro block. And the test path may further transmit the test data for testing the j-th macro block supplied from the supplier to the j-th macro block and supply data output from the j-th macro block to the comparator.

The semiconductor device may further comprise a second test path which supplies the test data to one of the macro blocks designated by the test circuit and transmits data which is the test data processed by the designated macro block. In this case, it is desirable that the test circuit tests all of the macro blocks with the test path, and if any defect is found in the macro blocks, then, tests each of the n macro blocks with the second test path, sequentially.

For example, the data path comprises a selector, first to n-th input terminal connectors and first to n-th output terminal connectors, and the first to n-th macro blocks include first to n-th circuits, respectively. In this case, for example, the selector selects one from between the test data supplied from the test circuit and the to-be-processed data of the first circuit and supplies selected one to the first input terminal connector, the first input terminal connector supplies an output from the selector to an input terminal of the first circuit; the k-th input terminal connector selects one from between an externally supplied to-be-processed data of the k-th circuit and an output from the k−1)th output terminal connector and supplies selected one to an input terminal of the k-th circuit; the n-th input terminal connector selects one from between an externally supplied to-be-processed data of n-th circuit and an output from the (n−1)th output terminal connector and supplies selected one to an input terminal of the n-th circuit; the first output terminal connector externally outputs an output from an output terminal of the first circuit or supplies the output from the output terminal to the second input terminal connector; the k-th output terminal connector externally outputs an output from an output terminal of the k-th circuit or supplies the output from the output terminal to the (k+1)th input terminal connector; and the n-th output terminal connector externally outputs an output from an output terminal of the n-th circuit or supplies the output from the output terminal to the test circuit. In a normal operation mode: the selector selects the to-be-processed data of the first circuit and supplies the to-be-processed data to the first input terminal connector, m-th (m is an integer from 2 to n) input terminal connector selects the to-be-processed data from the selector and supplies the to-be-processed data to the input terminal of the m-th circuit; and the m-th output terminal connector selects and externally outputs an output from an output terminal of the m-th circuit. On the other hand, in a test mode, the selector selects the test data output from the test circuit and supplies the test data to the first input terminal connector, the first input terminal connector supplies an output from the selector to the input terminal of the first circuit; the k-th input terminal connector selects an output from the (k−1)th output terminal connector and supplies selected output to the input terminal of the k-th circuit; the n-th input terminal connector selects an output from the (n−1)th output terminal connector and supplies selected output to the input terminal of the n-th circuit; the first output terminal connector supplies an output from the output terminal of the first circuit to the second input terminal connector, the k-th output terminal connector supplies an output from the output terminal of the k-th circuit to the (k+1)th input terminal connector, and the n-th output terminal connector supplies an output from the output terminal of the n-th circuit to the test circuit.

For example, each of the selector and the second to n-th input terminal connectors comprises a multiplexer of two inputs 1 one output type, and each of the output terminal connectors comprises a switch of one inputs/two outputs type.

The data path and the test path may comprise first to n-th selectors, first to n-th input terminal connectors and first to n-th output terminal connectors. In this case, the first to n-th macro blocks include first to n-th circuits, respectively; the first selector selects one from between an output from the second selector and to-be-processed data of the first circuit and supplies selected one to the first input terminal connector, the k-th k is a natural number from 2 to (n−1)) selector selects one from between an output from the (k+1)th selector and the to-be-processed data of the k-th circuit and supplies selected one to the k-th input terminal connector or the (k−1)th selector; the n-th selector selects one from between the test data supplied from the test circuit and the to-be-processed data of the n-th circuit and supplies selected one to the n-th input terminal connector or the (n−1)th selector, the first input terminal connector supplies an output from the first selector to an input terminal of the first circuit; the k-th input terminal connector selects one from between an output from the k-th selector and an output from the (k−1)th output terminal connector and supplies selected one to an input terminal of the k-th circuit or the k-th output terminal connector, the n-th input terminal connector selects one from between an output from the n-th selector and an output from the (n−1)th output terminal connector and supplies selected one to an input terminal of the n-th circuit or the n-th output terminal connector; the first output terminal connector externally outputs an output from an output terminal of the first circuit or supplies the output from the output terminal to the second input terminal connector; the k-th output terminal connector selects one from between an output from an output terminal of the k-th circuit and an output from the k-th input terminal connector and externally outputs selected one or supplies the selected one to the (k+1)th input terminal connector; and the n-th output terminal connector selects one from between an output from an output terminal of the n-th circuit and an output from the n-th input terminal connector and externally outputs selected one or supplies the selected one to the test circuit. In a normal operation mode, the m-th (m is a natural number from 1 to n) selector selects the to-be-processed data of the m-th circuit and supplies the to-be-processed data to the m-th input terminal connector, the m-th input terminal connector selects the to-be-processed data from the m-th selector and supplies the to-be-processed data to an input terminal of the m-th circuit; and the m-th output terminal connector selects and externally outputs an output from an output terminal of the m-th circuit. In a first test mode, the n-th selector selects the test data output from the test circuit and supplies the test data to the (n−1)th selector; the k-th selector selects an output from the (k+1)th selector and supplies selected output to the (k−1)th selector, the first selector selects an output from the second selector and supplies selected output to the first input terminal connector; the first input terminal connector supplies the output from the first selector to the input terminal of the first circuit; the k-th input terminal connector selects an output from the (k−1)th output terminal connector and supplies selected output to the input terminal of the k-th circuit; the n-th input terminal connector selects an output from the (n−1)th output terminal connector and supplies selected output to the input terminal of the n-th circuit; the first output terminal connector selects an output from the output terminal of the first circuit and supplies the output to the second input terminal connector, the k-th output terminal connector selects an output from the output terminal of the k-th circuit and supplies selected output to the (k+1)th input terminal connector, and the n-th output terminal connector selects an output from the output terminal of the n-th circuit and supplies selected output to the test circuit. In a second test mode where the controller designates the j-th circuit, the j-th selector selects the test data supplied from the test circuit and supplies the test data to the j-th input terminal connector; the j-th input terminal connector selects an output from the j-th selector and supplies selected output to an mput terminal of the j-th circuit; and the j-th output terminal connector selects an output from an output terminal of the j-th circuit and supplies the output to the test circuit.

For example, the first selector comprises a switch of two inputs/one output type, the k-th selector comprises a switch of two inputs/two outputs type and the n-th selector comprises a switch of two inputs/two outputs type; the k-th input terminal connector comprises a switch of two inputs/two outputs type and the n-th input terminal connector comprises a switch of two inputs/two outputs type; and the first output terminal connector comprises a switch of two inputs/two outputs type, the k-th output terminal connector comprises a switch of two inputs/two outputs type and the n-th output terminal connector comprises two inputs/two outputs type.

To achieve the above objects, a method for testing a semiconductor device which comprises first to n-th (n is a natural number more than 1) macro blocks, according to the second aspect of the present invention comprises:

a method for testing a semiconductor device which comprises first to n-th (n is a natural number more than 1) macro blocks, the method comprising:

supplying test data for testing the n macro blocks to the first macro block;

processing in the first macro block, the test data and outputting processed test data;

supplying data output from the h-th (h is a natural number from 1 to (n−1)) macro block to the (h+1)th macro block;

processing in the (h+1)th macro block, the data supplied to the (h+1)th macro block and outputting the processed data from the (h+1)th macro block;

supplying data output from the n-th macro block to the test circuit; and comparing, in the test circuit, the data output from the n-th macro block with expected data.

BRIEF DESCRIPTION OF THE DRAWINGS

These objects and other objects and advantages of the present invention will become more apparent upon reading of the following detailed description and the accompanying drawings in which:

FIGS. 9A and 9B are time charts showing a time period for testing the semiconductor device with a self-testing function by the method for testing the semiconductor device explained in FIG. 8.

DETAILED DESCRIPTION OF THE PREFERRED EMBODIMENTS

A semiconductor device with a self-testing function and a method for testing the semiconductor device according to embodiments of the present invention will now be described below with reference to the drawings.

First Embodiment

Figure 1:
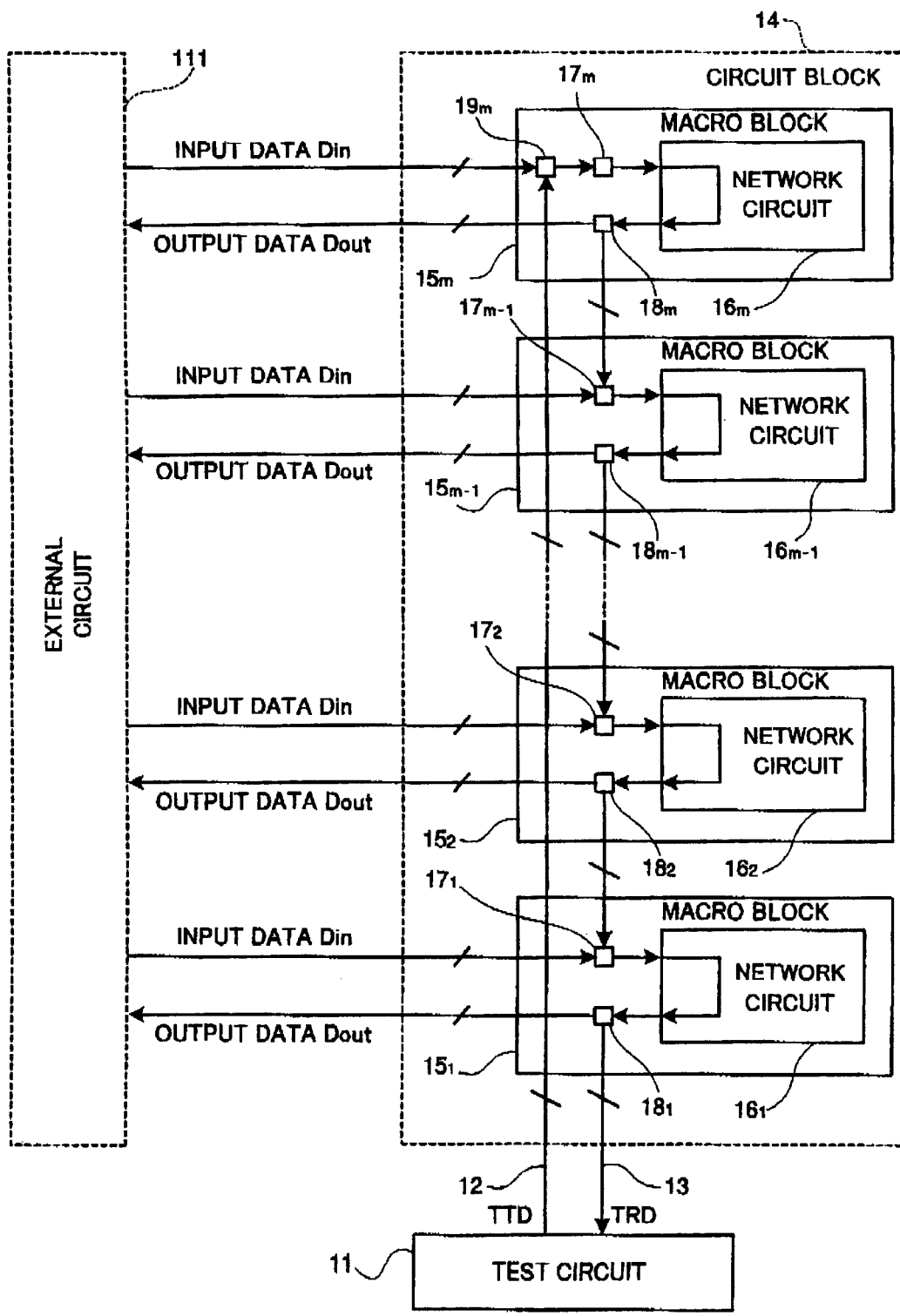
FIG. 1 is a block diagram for explaining the first embodiment of a semiconductor device with a self-testing function.

FIG. 1 is a block diagram for explaining a semiconductor device with a self-testing function according to the first embodiment of the present invention. This semiconductor device comprises a test circuit 11, a first test bus 12, a second test bus 13 and a circuit block 14. The circuit block 14 includes m (m is an integer more than 1) macro blocks $15_1$ to $15_m$. The macro blocks $15_1$ to $15_m$ include network circuits $16_1$ to $16_m$, selectors $17_1$ to $17_m$ and bifurcating sections $18_1$ to $18_m$, respectively. The macro block $15_m$ also includes a selector $19_m$.

Each of the selectors $17_1$ to $17_m$ and the selector $19_m$ is comprised of, for example, a multiplexer (or switch) having two input terminals and one output terminal, and selects and outputs one input in accordance with a control signal supplied form the test circuit 11. Each of the bifurcating sections $18_1$ to $18_m$ is comprised of, for example, a switch having one input terminal and two output terminals, and outputs an input signal at a selected output terminal in accordance with a control signal supplied from the test circuit 11.

In a normal operation mode, the selector $19_m$ receives the input data (n bits) Din from an external circuit 111 and supplies the input data Din to the selector $17_m$ so as to supply it to the network circuit $16_m$. In a test mode, the selector $19_m$ receives the test data TTD supplied from the test circuit 11 through the test bus 12 and supplies the test data TTD to the selector $17_m$ so as to supply it to the network circuit $16_m$.

In the normal operation mode, the selectors $17_1$ to $17_{m-1}$ receive the input data (n bits) Din directly and supply the input data Din to the network circuits $16_1$ to $16_{m-1}$, respectively. In the test mode, the selectors $17_1$ to $17_m$, receive processed data supplied from the bifurcating sections $18_2$ to $18_m$ of the adjacent macro blocks $15_2$ to $15_m$ and supply the processed data to the network circuits $16_1$ to $16_{m-1}$.

In the normal operation mode, the selector $17_m$ receives the input data Din via the selector $19_m$ and supplies the input data Din to the network circuit $16_m$. In the test mode, the selector $17_m$ receives the test data TTD via the selector $19_m$ and supplies the test data TTD to the network circuit $16_m$.

The bifurcating section $18_1$ receives data output from the network circuit $16_1$ and, in the normal operation mode, outputs the data as the output data (n bits) Dout to the external circuit 111, and in the test mode, outputs the data to the test circuit 11 as the processed data TRD through the second test bus 12.

The bifurcating sections $18_2$ to $18_m$ receive data output from the network circuits $16_2$ to $16_m$, and output, in the normal operation mode, the data as the output data (n bits) Dout to the external circuit 111, and, in the test mode, the data as the processed data to the selectors $17_1$ to $17_{m-1}$ of the adjacent macro blocks $15_1$ to $15_{m-1}$.

Figure 2:
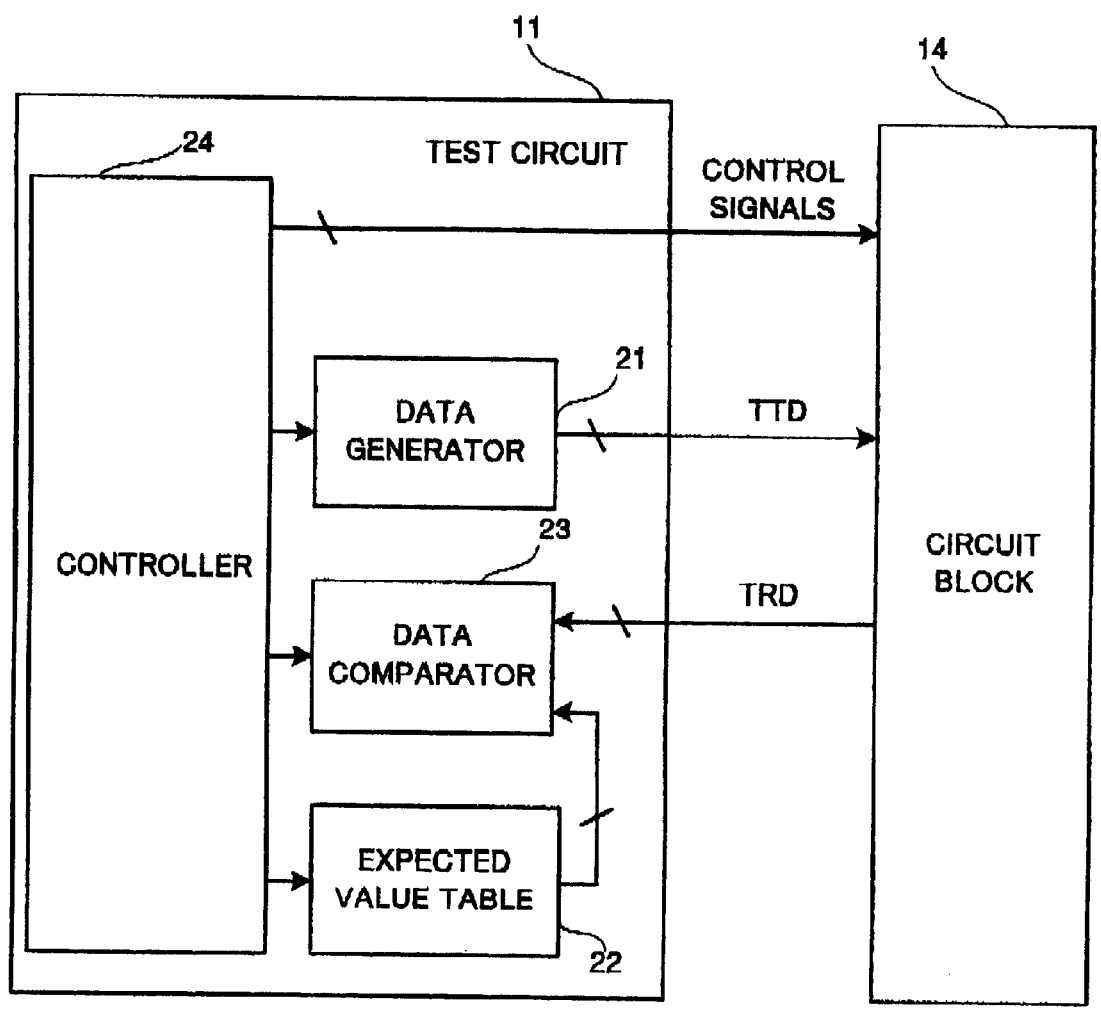
FIG. 2 is a circuit diagram of a test circuit shown in FIG. 1.

FIG. 2 is a block diagram showing the internal structure of the test circuit 11 shown in FIG. 1. As shown in FIG. 2, the test circuit comprises a data generator 21, an expected value table 22, a comparator 23 and a controller 24. The data generator 21 generates and outputs the test data TTD to the circuit block 14 through the first test bus 12. The expected value table 22 stores expected value data. The expected valued data is equal to the test data TDR adequately processed by the network circuits $16_1$ to $16_m$ sequentially. The comparator 23 receives the processed data TRD and corresponding expected value data, compares them with each other and determines whether a tested macro block is deficient or not. The controller 24 controls the data generator 21, the expected value table 22 and the comparator 23. Further, the controller 24 controls the selection of data paths (route of data flow) by controlling the selectors $17_1$ to $17_m$ and $19_m$, and the bifurcating sections $18_1$ to $18_m$.

The controller 24 controls the selectors $17_1$ to $17_m$ and $19_m$, and the bifurcating sections $18_1$ to $18_m$ by supplying control signals to them.

A register, a ROM or the like can be used as the expected value table 22 shown in FIG. 2. Instead of providing the expected value table 22, the comparator 23 may generate the expected value data internally under control by the controller 24. Further, the expected value data may be externally supplied to the semiconductor device. In this case, the comparator 23 receives the externally provided expected value data when the semiconductor device performs testing. The PRBS (Pseudo Random Bit Stream) can be used as the test data TTD. The PRBS is a stream of random bit data generated in accordance with a generation polynomial.

The operation of the semiconductor device will now be described.

In a normal operation mode, the selector $17_1$ to $17_{m-1}$ and $19_m$ select the input data Din from the external circuit 111 and the selector $17_m$ selects data from the selector $19_m$. Therefore, the input data Din is supplied to the network circuit $16_1$ to $16_m$. The network circuit $16_1$ to $16_m$ process the input data Din and output processed data to the bifurcating section $18_1$ to $18_m$. The bifurcating section $18_1$ to $18_m$ select the processed data and output it to the external circuit 111 as the output data Dout.

Next, the test operation of the semiconductor device and method for testing the circuit block 14 will now be described with reference to FIG. 3.

Figure 3:
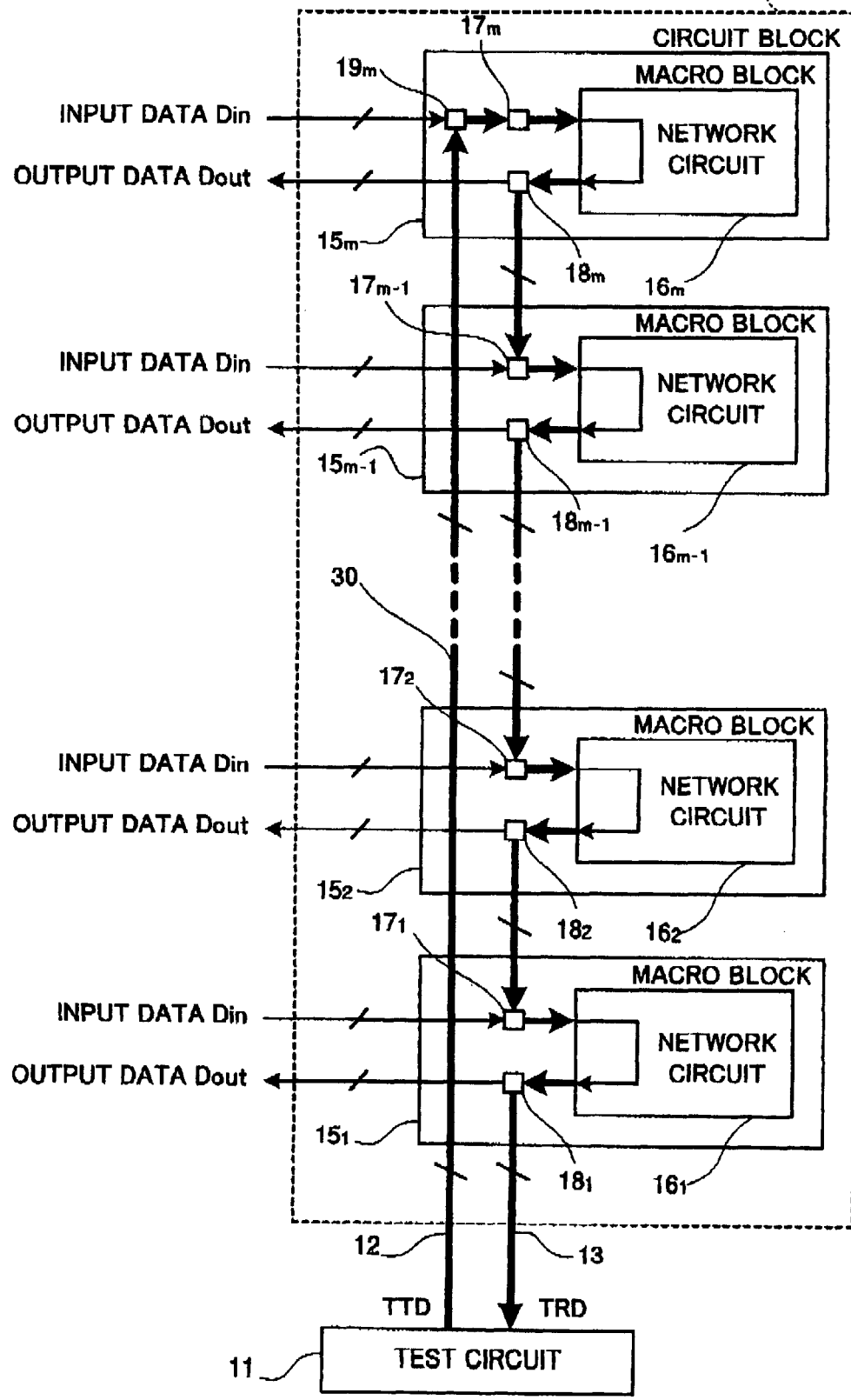
FIG. 3 is a diagram showing a data route in the semiconductor device with a self-testing function shown in FIG. 1.

FIG. 3 is a diagram showing a route through which data flows, in the test mode, in the semiconductor device shown in FIG. 1. In this test mode, all of the macro blocks $16_1$ to $16_m$ in the semiconductor device shown in FIG. 1 are tested at a time.

The test circuit 11 supplies the test data TTD through the first test bus 12 to the circuit block 14. The test data TTD supplied to the circuit block 14 is supplied to the selector $19_m$ of the macro block $15_m$. The selector $19_m$ selects the test data TTD and supplies it to the selector $17_m$. The selector $17_m$ supplies the test data TTD to the network circuit $16_m$. The network circuit $16_m$ receives the test data TTD, processes the test data TTD and outputs processed data to the bifurcating section $18_m$. The bifurcating section $18_m$ receives the processed data and outputs it to the selector $17_{m-1}$ of the adjacent macro block $15_{m-1}$. The selector $17_{m-1}$ supplies the processed data to the network circuit $16_{m-1}$. The network circuit $16_{m-1}$ receives the processed data, further processes the processed data and outputs the processed data to the bifurcating section $18_{m-1}$. The bifurcating section $18_{m-1}$ receives the processed data, and outputs it to the adjacent macro block $15_{m-2}$. In the same manner, the processed data is sequentially transmitted to adjacent macro blocks and further processed.

The selector $17_1$ of the macro block $15_1$ receives processed data from the macro block $15_2$. The selector $17_1$ supplies the processed data to the network circuit $16_1$. The network circuit $16_1$ further processes received processed data and outputs the processed data to the bifurcating section $18_1$. The bifurcating section $18_1$ supplies the processed output data as the processed data TRD to the test circuit 11.

The comparator 23 of the test circuit 11 compares the processed data TRD with the expected value pre-stored in the expected value table 22 to determine whether the processed data TRD and the expected data substantially coincide with each other. If there is at least one defect at any one of the macro blocks $15_1$ to $15_m$ and/or buses 12 and 13, they do not coincide with each other. Therefore, the controller 24 determines that the target semiconductor device has defect if the coincidence is not found, and that the target semiconductor device has no defect if the coincidence is found.

As described above, each macro block receives the test data output from the adjacent macro block. Accordingly, testing can be performed to all of the macro blocks sequentially in a short period of time, forming the data route 30 which is like a line drawn in one stroke.

Figure 4:
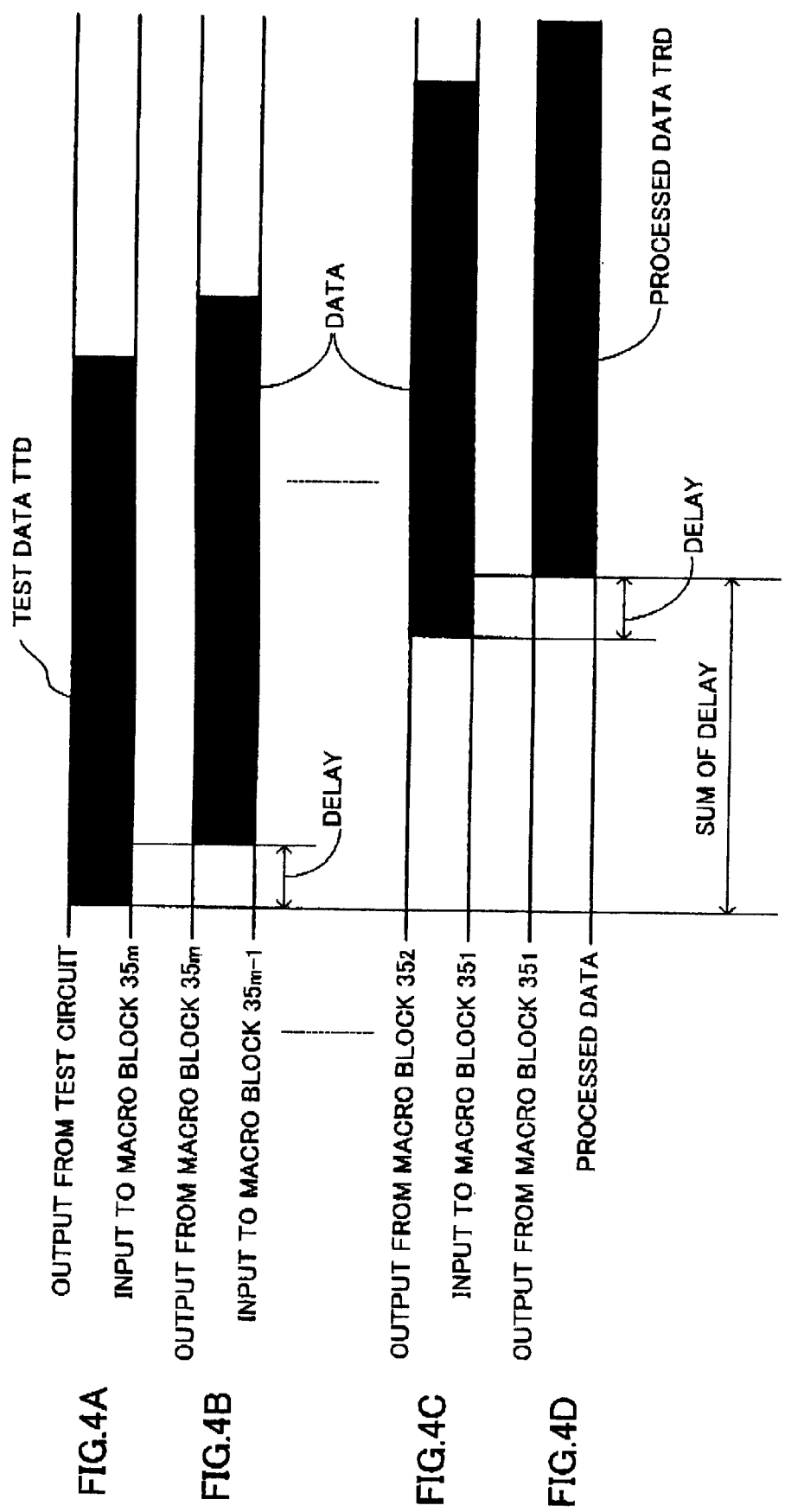
FIGS. 4A to 4D are time charts showing a time period for testing the semiconductor device.

FIGS. 4A to 4D are time charts for explaining time period required for testing the semiconductor device. As shown in FIG. 4A, the test data TTD output from the test circuit 11 is supplied to the macro block $15_m$ without delay. Assume that the length of the data supplied to each macro blocks $15_i$ from the adjacent macro block $15_{i+1}$ is equal to the length of the original test data TTD.

The output of the data from the macro block $15_m$ and the input of the data to the macro block $15_{m-1}$ are performed later than the input of the test data TTD to the macro block $15_m$ by a delay period as shown in FIGS.4A and 4B. The delay period is a time period required for internal transmission of data in the macro block $15_m$, which is substantially equal to the time period required for data processing by the network circuit $16_m$. In the same manner, the data flows through the macro blocks $15_m$ to $15_1$ sequentially, with the delay as shown in FIGS. 4A to 4D.

The input of the processed data TRD to the test circuit 11 is delayed from the output of the test data TTD from the test circuit 11 by the sum of the time periods of delay in each of macro blocks $15_m$ to $15_1$. The sum of the time periods of delay varies according to the specification of the macro blocks, the number of macro blocks, arrangement of the macro blocks and the like. The processed data TRD is compared with the expected value with such delay taken into consideration. Due to this, even if internal transmission delay is caused, the delay has no influence on the test result.

The time period for testing the semiconductor device shown in FIGS. 1 and 3 is calculated by the following equation as known from FIGS. 4A to 4D.

time period for testing the semiconductor device=(time period for transmission of the test data TTD)+(sum of the time periods of delay by the internal transmission)

Generally, the sum of the time periods of delay by the internal transmission is short in comparison with the time period for transmission of the test data. For example, in the case of a semiconductor device including ten macro blocks each of which requires 500 msec for testing it, if the macro blocks are tested sequentially, it takes 5 sec (500 msec×10) to test all the macro blocks. If this semiconductor device is tested with using the data route 30 shown in FIG. 3, the time period for testing is approximately 500 msec. One to two micro sec is required as the sum of the delay. However, one to two micro sec is sufficiently short compared to the time period for transmission of the test data.

As explained above, the semiconductor device with a self-testing function and the method for testing the semiconductor device explained in the first embodiment can test all the macro blocks included in the semiconductor device by transmitting the test data TTD only once though the route like a line drawn in one stroke. Due to this, the operation of a large number of macro blocks can be tested in a time period almost equal to the time period for testing one macro block. Due to this, all the macro blocks can be tested in a short period of time. This testing method is effective to determine whether the semiconductor device has deficient or not in a short period of time.

The test data is transmitted and received between a plurality of macro blocks 15 and the test circuit 11, with two buses 12 and 13. Therefore, the size of the test circuit 11 and buses is unchanged regardless of the number of macro blocks.

Second Embodiment

The semiconductor device of the first embodiment can detect whether the semiconductor device has defect or not. But, they can not detect the location or position of defect in the semiconductor device. The second embodiment of the semiconductor device with the self-testing function which can detect the location of the defect will be explained.

Figure 5:
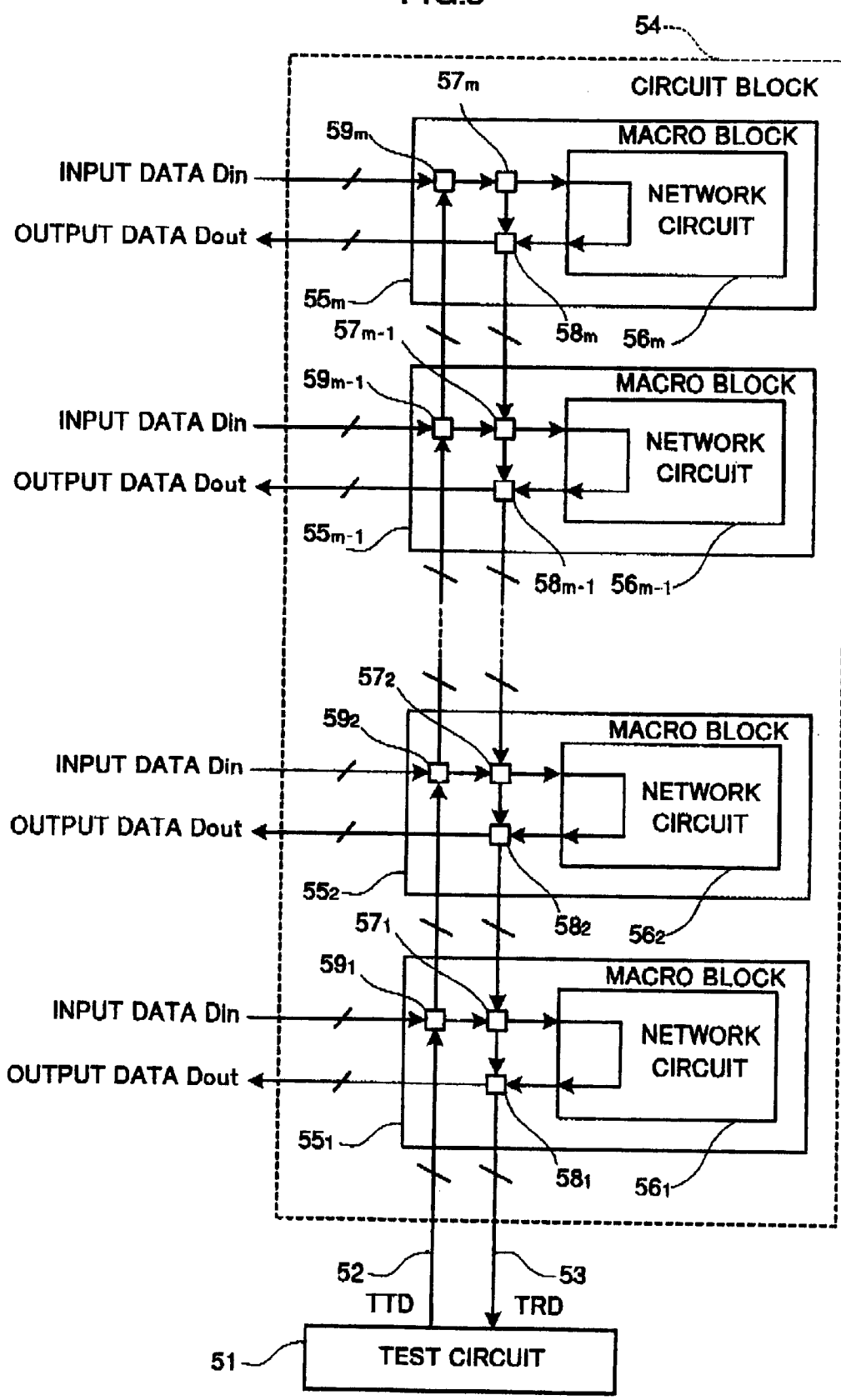
FIG. 5 is a block diagram for explaining the second embodiment of a semiconductor device with a self-testing function.

FIG. 5 is a block diagram for explaining the second embodiment of a semiconductor device with a self-testing function.

As shown, the semiconductor device comprises a test circuit 51, a first test bus 52, a second test bus 53 and a circuit block 54. The circuit block 54 includes m (m is an integer more than 1) macro blocks $55_1$ to $55_m$. The macro blocks $55_1$ to $55_m$ include network circuits $56_1$ to $56_m$, selectors $57_1$ to $57_m$, $58_1$ to $58_m$ and $59_1$ to $59_m$, respectively.

The structure of the semiconductor device shown in FIG. 5 is basically the same as that of the semiconductor device shown in FIG. 1. The internal structure of the test circuit 51 is the same as that of the test circuit 11 shown in FIG. 2.

The semiconductor device shown in FIG. 5 is different from the semiconductor device shown in FIG. 1 in that data paths are provided to directly connect the selectors $57_1$ to $57_m$ and the selectors $58_1$ to $58_m$, respectively, and that the selectors $59_1$ to $59_m$ are provided not only to the macro block $55_m$ but to all of the macro blocks $55_1$ to $55_m$.

In the normal operation mode, the selectors $59_1$ to $59_m$ receive the input data (n bits) Din and output it on paths to supply the input data Din to the selectors $57_1$ to $57_m$ so that the input data Din is supplied to the network circuit $56_1$ to $56_m$, respectively.

In the test mode, the selector $59_1$ receives the test data TTD from the test circuit 51 and selects a path to supply the test data TTD to the selector $57_1$ so that the test data TTD is supplied to the network circuit $56_1$ or a path to supply the test data TTD to the selectors $59_2$ of the macro blocks $55_2$ so that the test data TTD is supplied to the macro blocks $55_2$ to $55_m$.

In the test mode, the selectors $59_2$ to $59_{m-1}$ receive the data via the selectors $59_1$ to $59_{m-2}$ of the adjacent macro blocks $55_1$ to $55_{m-2}$ and select paths to supply the test data TTD to the selectors $57_2$ to $57_{m-1}$ so that the test data TTD is supplied to the network circuits $56_2$ to $56_{m-1}$ or paths to supply the test data TTD to the selectors $59_3$ to $59_m$ of the adjacent macro blocks $55_3$ to $55_m$ so that the test data TTD is supplied to the adjacent macro blocks $55_3$ to $55_m$.

In the test mode, the selector $59_m$ receives the test data TTD via the selector $59_{m-1}$ of the adjacent macro block $55_{m-1}$ and selects a path to supply the test data TTD to the selector $57_m$ so that the test data TTD is supplied to the network circuit $56_m$.

In the normal operation mode, the selectors $57_1$ to $57_m$ receive the input data Din via the selectors $59_1$ to $59_m$ and select paths to supply the input data Din to the network circuit $56_1$ to $56_m$.

In the test mode, the selector $57_1$ selectively receives the test data TTD via the selector $59_1$ and the processed data TRD output from the selector $58_2$ of the adjacent macro block $55_2$, and selects a path to supply the received data to the network circuit $56_1$ or a path to supply the received data to the selector $58_1$ of the macro block $55_1$ so that the received data is supplied to the test circuit 51.

In the test mode, the selectors $57_2$ to $57_{m-1}$ selectively receive the test data TTD via the selectors $59_2$ to $59_{m-1}$ and the processed data output from the selectors $58_3$ to $58_m$ of the adjacent macro blocks $55_3$ to $55_m$. Then, the selectors $57_2$ to $57_{m-1}$ select paths to supply the received data to the network circuits $56_2$ to $56_{m-1}$ or paths to supply the received data to the selectors $58_2$ to $58_{m-1}$ of the macro blocks $55_2$ to $55_{m-1}$ so that the received data is supplied to the adjacent macro blocks $55_1$ to $55_{m-2}$.

In the test mode, the selector $57_m$ receives the test data TTD which comes via the selector $59_m$ and selects a path to supply the received data to the network circuit $56_m$.

In the normal operation mode, the selectors $58_1$ to $58_m$ receive data output from the network circuit $56_1$ to $56_m$ and select paths to output the received data as the output data Dout. In the test mode, the selector $58_1$ selectively receives data output from the network circuit $56_1$ and data from the selector $57_1$ of the macro block $55_1$ and selects a path to supply the received data to the test circuit 51.

In the test mode, the selectors $58_2$ to $58_m$ selectively receive data output from the network circuits $56_2$ to $56_m$ and data output from the selectors $57_2$ to $57_m$ of the macro blocks $55_2$ to $55_m$. Then, the selectors $58_2$ to $58_m$ select paths to supply the received data to the selectors $57_1$ to $57_{m-1}$ of the adjacent macro blocks $55_1$ to $55_{m-1}$.

All of the macro blocks $55_1$ to $55_m$ can be tested at a time by transmitting the test data through a data route similar to the data route 30 of the first embodiment explained with reference to FIG. 3.

In the case where all of the macro blocks are to be tested at a time, the selector $59_1$ receives the test data TTD output from the test circuit 51 and selects a path to supply it to the selectors $59_2$, the selectors $59_2$ to $59_{m-1}$ receive the test data TTD output from the selectors $59_1$ to $59_{m-2}$ and select paths to supply it to the selectors $59_3$ to $59_m$, and the selector $59_m$ receives the test data TTD output from the selector $59_{m-1}$ and selects a path to supply it to selector $57_m$. The selector $57_m$ receives the test data TTD from the selector $59_m$ and selects a path to supply it to the network circuit $56_m$, the selectors $57_1$ to $57_{m-1}$ receive the data from the selectors $58_2$ to $58_m$ and select paths to supply it to the network circuits $56_1$ to $56_{m-1}$, respectively. The selectors $58_2$ to $58_m$ receive the processed data output from the network circuits $56_2$ to $56_m$ and select paths to supply it to the selectors $57_1$ to $57_{m-1}$, respectively and the selector $58_1$ receives the data output from the network circuits $56_1$ and select a path to supply it to the test circuit 51.

Figure 6:
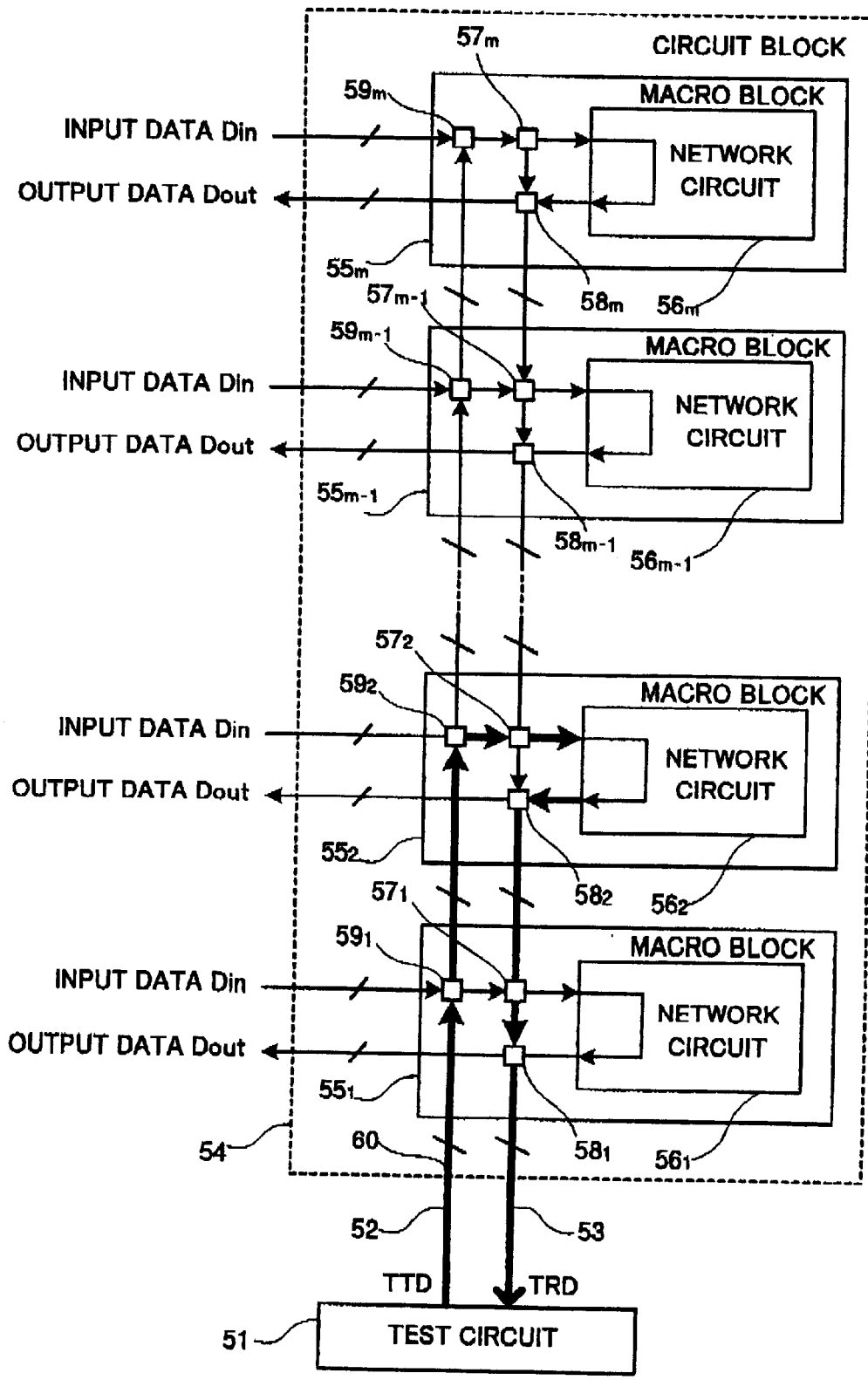
FIG. 6 is a diagram showing a data route in the semiconductor device with a self-testing function shown in FIG. 5.
Figure 7:
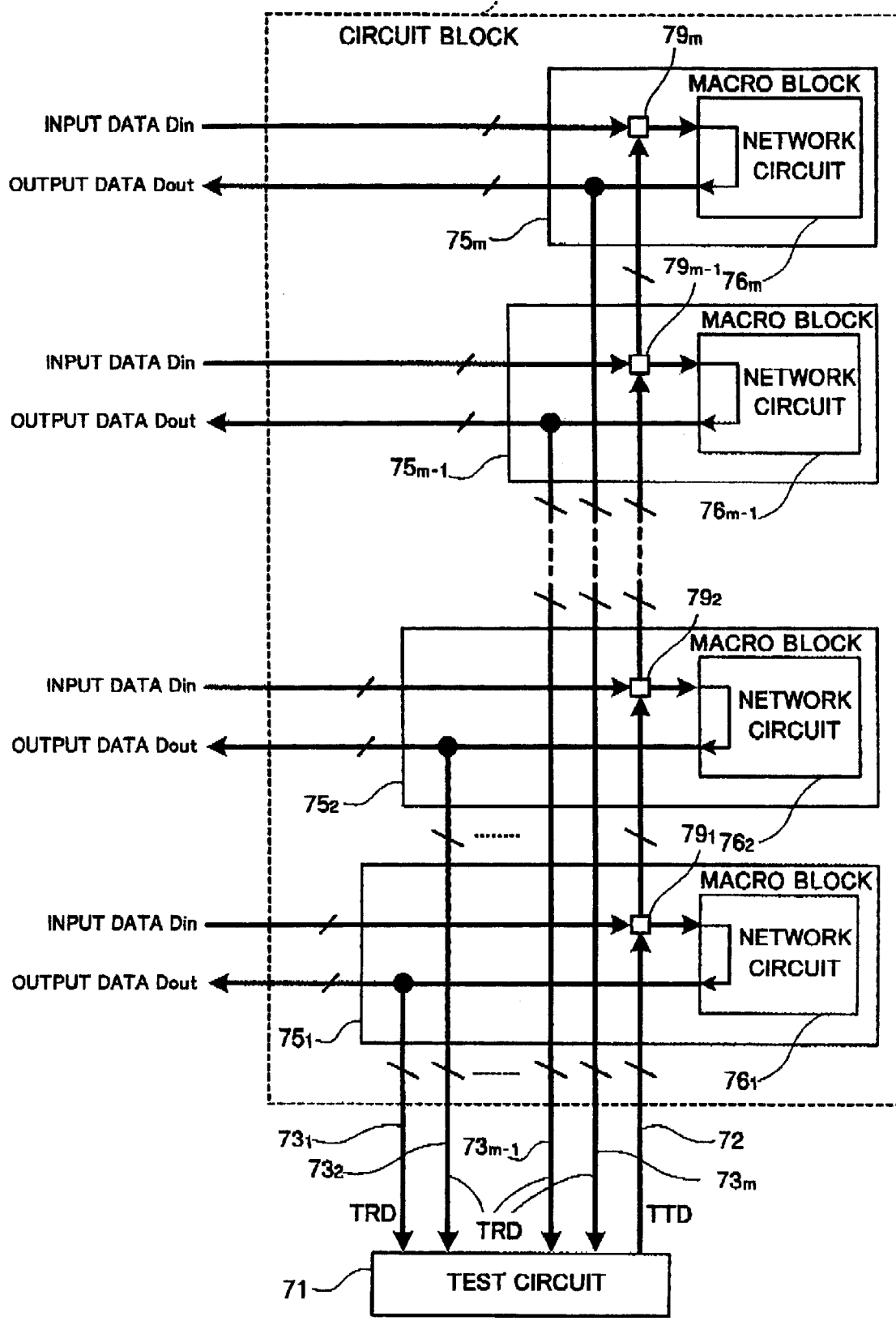
FIG. 7 is a block diagram for explaining an example of a conventional semiconductor device with a self-testing function.
Figure 8:
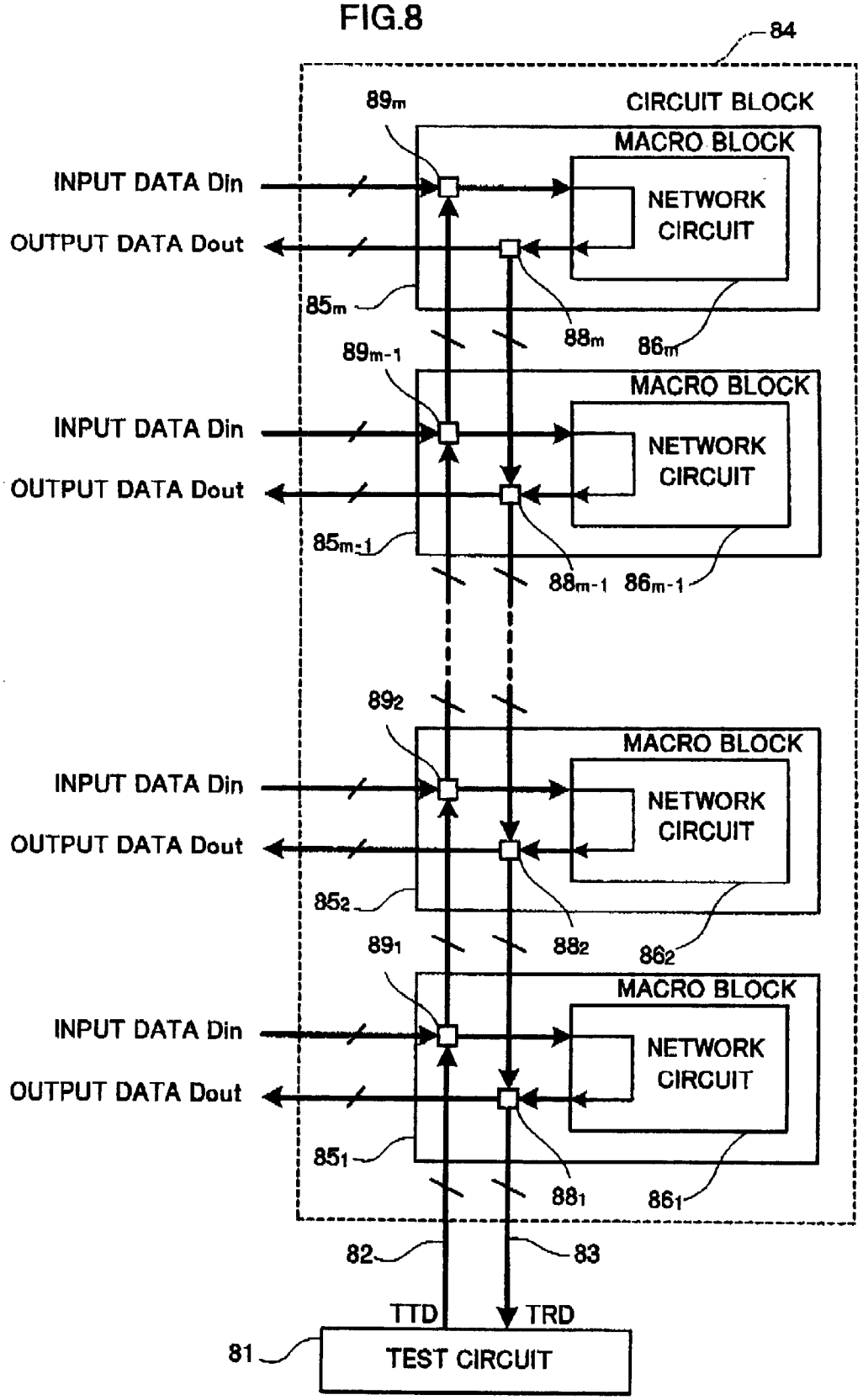
FIG. 8 is a block diagram for explaining another example of a conventional semiconductor device with a self-testing function.

FIG. 6 is a diagram showing a data route 60 for testing selected one of the macro blocks $56_1$ to $56_m$, in the semiconductor device shown in FIG. 5.

The test circuit 51 designates a macro block to be tested and selects a path of each of the selectors to establish a data route 60 (indicated by a bold line in FIG. 6) through which a signal can be transmitted and received between the test circuit 51 and the designated macro block.

For easy understanding, it is assumed that the macro block $55_2$ will be tested as shown in FIG. 6. In this case, the selector $59_1$ receives the test data TTD from the test circuit 51 and selects a path to supply the test data TTD to the selectors $59_2$ of the macro blocks $55_2$, the selector $59_2$ receives the data from the selector $59_1$ and selects a path to supply the test data TTD to the selectors $57_2$, the selector $57_2$ receives the test data TTD and selects a path to supply it to the network circuit $56_2$, the selector $58_2$ receives the processed data output from the network circuit $56_2$ and selects a path to supply it to the selector $57_1$, the selector $57_1$ receives the data from the selector $58_2$ and selects a path to supply it to the selector $58_1$, and the selector $58_1$ receives the data from the selector $57_1$ and selects a path to supply it to the test circuit 51.

The test circuit 11 supplies the test data TTD through the first test bus 52. The test data TTD is transmitted to the network circuit $56_2$ through the data route 60 including selectors $59_1$, $59_2$, and $57_2$.

The network circuit $56_2$ receives the test data TTD, processes the test data TTD and supplies the processed test data TTD as the processed data TRD to the test circuit 11 through the data route 60 including selector $58_2$, $57_1$, and $58_1$. Accordingly, the specific macro block $55_2$ can be selected from among the plurality of macro blocks $55_1$ to $55_m$ and be tested.

The controller of the test circuit 51, for example, first, tests the plurality of macro blocks $55_1$ to $55_m$ at a time, then, if defect is detected, it tests each of the plurality of macro blocks $55_1$ to $55_m$ sequentially.

The semiconductor device and the method of the second embodiment can test all the macro blocks by transmitting the test data TTD only once through a data route like a line drawn in one stroke explained in the first embodiment. Due to this, even in the case where a large number of macro blocks are tested, those macro blocks can be tested in a time period which is almost the same as the time period for testing one macro block. Further, the semiconductor device of the second embodiment can select one specific macro block from among a plurality of macro blocks and test the selected macro block individually. This testing method is effective for analyzing in detail a semiconductor device which is detected as a deficient one. For example, when a deficiency is found as a result of testing all the macro blocks at a time, each of the macro blocks is individually tested until the deficient macro block is specified, or all the macro blocks are tested individually.

In the above mentioned embodiments, the test data is transmitted and received between a plurality of macro blocks and the test circuit, with use of only two buses. Therefore, the size of the test circuit of the semiconductor device is unchanged regardless of the number of macro blocks included in the semiconductor device. Due to this, the time period for testing the semiconductor device and areas needed for the test buses and the test circuit are almost the same as those of a semiconductor device including one macro block.

In the embodiments described above, a semiconductor device having a test circuit has been explained. However, the test circuit may be provided out of the semiconductor device. In this case, an outside device having the function of the test circuit supplies the test data TTD into the circuit block and the circuit block outputs the processed data TRD to the outside device so that the outside device determines whether the semiconductor device works adequately or not.

In the embodiments described above, the positional relation between the adjacent macro blocks is not limited to the physical adjacency but may include the theoretical adjacency.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2000-135093 filed on May 8, 2000 and including specification, claims, drawings and summary. The disclosure of the above Japanese Patent Application is incorporated herein by reference in its entirety.

What is claimed is:

1. A semiconductor device with a self-testing function, comprising:
    first to n-th (n is an integer more than 1) macro blocks each of which receives input data, processes the input data, and outputs processed data;
    a data path which supplies data to-be-processed to said n macro blocks, and transmits processed data processed by and output from said n macro blocks respectively, in a normal operation mode;
    a test circuit which outputs test data for testing said n macro blocks and receives test data processed by said n macro blocks, in a test mode; and
    a test path which supplies the test data output from said test circuit to said first macro block, supplies data output from h-th (h is an integer from 1 to (n−1)) macro block to (h+1)th macro block and supplies data output from said n-th macro block to said test circuit.

2. The semiconductor device according to claim 1, wherein
said test path comprises:
    a first test bus which transmits the test data output from said test circuit to said first macro block;
    connectors which transmit data output from said h-th macro block to said (h+1)th macro block; and a second test bus which transmits data output from said n-th macro block to said test circuit.

3. The semiconductor device according to claim 1, wherein said test circuit compares data received from said n-th macro block and an expected value, and detects that at least a defect exists in at least one of said first to n-th macro blocks if received data substantially does not coincide with the expected value.

4. The semiconductor device according to claim 1, wherein said test circuit comprises: a supplier which supplies the test data; and a comparator which compares expected data with data received from said n-th macro block.

5. The semiconductor device according to claim 4, wherein:
said test circuit further comprises: a controller which designates j-th (j is an integer from 1 to n) macro block;
said supplier supplies test data for testing said j-th macro block designated by said controller;
said comparator compares expected data for said j-th macro block with data output from said j-th macro block; and
said test path transmits said test data for testing said j-th macro block supplied from said supplier to said j-th macro block and supplies data output from said j-th macro block to said comparator.

6. The semiconductor device according to claim 5, wherein:
said controller performs control to test i-th macro block individually, if any defect is found by said test circuit.

7. The semiconductor device according to claim 1, wherein:
said test circuit comprises: a controller which designates j-th (j is an integer from 1 to n) macro block; a supplier which supplies test data for testing said j-th macro block designated by said controller; and a comparator which compares expected data for said j-th macro block with data output from said j-th macro block; and
said test path further transmits said test data for testing said j-th macro block supplied from said supplier to said j-th macro block and supplies data output from said j-th macro block to said comparator.

8. The semiconductor device according to claim 1, further comprising a second test path which supplies the test data to one of the macro blocks designated by said test circuit and transmits data which is the test data processed by designated macro block, and wherein
said test circuit tests all of the macro blocks with said test path, and if any defect is found in the macro blocks, then, tests, each of the n macro blocks with said second test path, sequentially.

9. The semiconductor device according to claim 1, wherein:
said data path comprises a selector, first to n-th input terminal connectors and first to n-th output terminal connectors;
said first to n-th macro blocks include first to n-th circuits, respectively;
said selector selects one from between the test data supplied from said test circuit and the to-be-processed data of said first circuit and supplies selected one to said first input terminal connector;
said first input terminal connector supplies an output from said selector to an input terminal of said first circuit;
k-th input terminal connector selects one from between an externally supplied to-be-processed data of the k-th circuit and an output from (k−1)th output terminal connector and supplies selected one to an input terminal of k-th circuit;
said n-th input terminal connector selects one from between an externally supplied to-be-processed data of n-th circuit and an output from (n−1)th output terminal connector and supplies selected one to an input terminal of said n-th circuit;
said first output terminal connector externally outputs an output from an output terminal of said first circuit or supplies the output from the output terminal to said second input terminal connector;
k-th output terminal connector externally outputs an output from an output terminal of said k-th circuit or supplies the output from the output terminal to (k+1)th input terminal connector; and
said n-th output terminal connector externally outputs an output from an output terminal of said n-th circuit or supplies the output from the output terminal to said test circuit,
in a normal operation mode:
said selector selects the to-be-processed data of said first circuit and supplies the to-be-processed data to said first input terminal connector,
m-th (m is an integer from 2 to n) input terminal connector selects the to-be-processed data from said selector and supplies the to-be-processed data to said input terminal of m-th circuit; and
said m-th output terminal connector selects and externally output an output from said output terminal of said m-th circuit,
in a test mode:
said selector selects the test data output from said test circuit and supplies the test data to said first input terminal connector,
said first input terminal connector supplies an output from said selector to said input terminal of said first circuit;
said k-th input terminal connector selects an output from said (k−1)th output terminal connector and supplies selected output to said input terminal of said k-th circuit;
said n-th input terminal connector selects an output from said (n−1)th output terminal connector and supplies selected output to said input terminal of said n-th circuit;
said first output terminal connector supplies an output from said output terminal of said first circuit to said second input terminal connector;
said k-th output terminal connector supplies an output from said output terminal of said k-th circuit to said (k+1)th input terminal connector; and
said n-th output terminal connector supplies an output from said output terminal of said n-th circuit to said test circuit.

10. The semiconductor device according to claim 9, wherein:
each of said selector and said second to n-th input terminal connectors comprises a multiplexer of two inputs/one output type;
each of said output terminal connectors comprises a switch of one inputs/two outputs type.

11. The semiconductor device according to claim 7, wherein:
said data path and said test path comprise first to n-th selectors, first to n-th input terminal connectors and first to n-th output terminal connectors;

said first to n-th macro blocks include first to n-th circuits, respectively;

said first selector selects one from between an output from said second selector and to-be-processed data of said first circuit and supplies selected one to said first input terminal connector, k-th (k is a natural number from 2 to (n−1)) selector selects one from between an output from (k+1)th selector and the to-be-processed data of said k-th circuit and supplies selected one to said k-th input terminal connector or (k−1)th selector;

n-th selector selects one from between the test data supplied from said test circuit and the to-be-processed data of said n-th circuit and supplies selected one to said n-th input terminal connector or (n−1)th selector, said first input terminal connector supplies an output from said first selector to an input terminal of said first circuit;

said k-th input terminal connector selects one from between an output from said k-th selector and an output from (k−1)th output terminal connector and supplies selected one to an input terminal of k-th circuit or said k-th output terminal connector;

n-th input terminal connector selects one from between an output from said n-th selector and an output from said (n−1)th output terminal connector and supplies selected one to an input terminal of said n-th circuit or said n-th output terminal connector;

said first output terminal connector externally outputs an output from an output terminal of said first circuit or supplies the output from the output terminal to said second input terminal connector;

said k-th output terminal connector selects one from between an output from an output terminal of said k-th circuit and an output from said k-th input terminal connector and externally outputs selected one or supplies the selected one to said (k+1)th input terminal connector; and said n-th output terminal connector selects one from between an output from an output terminal of said n-th circuit and an output from said n-th input terminal connector and externally outputs, selected one or supplies the selected one to said test circuit, in a normal operation mode:

m-th (m is a natural number from 1 to n) selector selects the to-be-processed data of said m-th circuit and supplies the to-be-processed data to said m-th input terminal connector;

said m-th input terminal connector selects the to-be-processed data from said m-th selector and supplies the to-be-processed data to an input terminal of said m-th circuit; and said m-th output terminal connector selects and externally outputs an output from an output terminal of said m-th circuit, in a first test mode:

said n-th selector selects the test data output from said test circuit and supplies the test data to (n−1)th selector;

said k-th selector selects an output from (k+1)th selector and supplies selected output to (k−1)th selector;

said first selector selects an output from said second selector and supplies selected output to said first input terminal connector;

said first input terminal connector supplies the output from said first selector to said input terminal of said first circuit;

said k-th input terminal connector selects an output from said (k−1)th output terminal connector and supplies selected output to said input terminal of said k-th circuit;

said n-th input terminal connector selects an output from said (n−1)th output terminal connector and supplies selected output to said input terminal of said n-th circuit;

said first output terminal connector selects an output from said output terminal of said first circuit and supplies the output to said second input terminal connector;

said k-th output terminal connector selects an output from said output terminal of said k-th circuit and supplies selected output to said (k+1)th input terminal connector; and said n-th output terminal connector selects an output from said output terminal of said n-th circuit and supplies selected output to said test circuit, in a second test mode, in a case where said controller designates j-th circuit;

said j-th selector selects the test data supplied from said test circuit and supplies the test data to said j-th input terminal connector;

said j-th input terminal connector selects an output from said j-th selector and supplies selected output to an input terminal of said j-th circuit; and said j-th output terminal connector selects an output from an output terminal of said j-th circuit and supplies the output to said test circuit.

12. The semiconductor device with a self-testing function according to claim 11, wherein:

said first selector comprises a switch of two inputs/one output type, said k-th selector comprises a switch of two inputs/two outputs type and said n-th selector comprises a switch of two inputs/two outputs type;

said k-th input terminal connector comprises a switch of two inputs/two outputs type and said n-th input terminal connector comprises a switch of two inputs/two outputs type; and said first output terminal connector comprises a switch of two inputs/two outputs type, said k-th output terminal connector comprises a switch of two inputs/two outputs type and said n-th output terminal connector comprises a switch of two inputs/two outputs type.

13. A method for testing a semiconductor device which comprises first to n-th (n is a natural number more than 1) macro blocks, said method comprising:

supplying test data for testing said n macro blocks to said first macro block;

processing in said first macro block, the test data and outputting processed test data;

supplying data output from an said h-th (h is a natural number from 1 to (n−1)) macro block to an (h+1)th macro block;

processing in said (h+1)th macro block, the data supplied to said (h+1)th macro block and outputting the processed data from said (h+1)th macro block;

supplying data output from said n-th macro block to said test circuit; and comparing, in said test circuit, the data output from said n-th macro block with expected data.

* * * * *